(12) United States Patent
Kurita et al.

(10) Patent No.: US 6,737,588 B1
(45) Date of Patent: May 18, 2004

(54) PROCESSES FOR MANUFACTURING FLEXIBLE WIRING BOARDS AND THE RESULTING FLEXIBLE WIRING BOARD

(75) Inventors: Hideyuki Kurita, Tochigi (JP); Masanao Watanabe, Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/640,862

(22) Filed: Aug. 18, 2000

(30) Foreign Application Priority Data

Aug. 26, 1999 (JP) ............................................ 11-239358

(51) Int. Cl.[7] .................................................. H05K 1/00
(52) U.S. Cl. ...................... 174/254; 174/256; 174/259; 174/262; 174/264; 361/750; 361/792
(58) Field of Search ................................ 174/254, 255, 174/256, 259, 261, 262, 264, 263, 267, 265; 361/749, 750, 751, 792, 795, 803

(56) References Cited

U.S. PATENT DOCUMENTS

| | | | | |
|---|---|---|---|---|
| 4,604,160 A | * | 8/1986 | Murakami et al. | ............ 216/18 |
| 5,401,913 A | | 3/1995 | Gerber et al. | |
| 5,457,881 A | * | 10/1995 | Schmidt | ........................ 29/830 |
| 5,478,972 A | * | 12/1995 | Mizutani et al. | ............. 174/250 |
| 5,600,103 A | * | 2/1997 | Odaira et al. | ................ 174/265 |
| 5,736,681 A | * | 4/1998 | Yamamoto et al. | ......... 174/265 |
| 5,737,833 A | * | 4/1998 | Motomura et al. | ........... 29/830 |
| 5,886,409 A | * | 3/1999 | Ishino et al. | ................. 257/737 |
| 5,915,753 A | * | 6/1999 | Motomura et al. | ........... 29/830 |

FOREIGN PATENT DOCUMENTS

| | | |
|---|---|---|
| DE | 1765926 | 11/1971 |
| JP | 01053591 | 3/1989 |
| JP | 5-299801 | 11/1993 |
| JP | Hei 7-79075 | 3/1995 |
| JP | Hei 7-074466 | 3/1995 |
| JP | Hei 07-086749 | 3/1995 |
| JP | Hei 8-125344 | 5/1996 |
| JP | Hei 8-264939 | 10/1996 |

\* cited by examiner

*Primary Examiner*—Kamand Cuneo
*Assistant Examiner*—J B Patel
(74) *Attorney, Agent, or Firm*—Oliff & Berridge, PLC

(57) ABSTRACT

Against a first resin film formed on a first metal film are pressed bumps on a second metal film so that the bumps are embedded into the first resin film. Either one of the first metal film or the second metal film or both is (are) patterned while the bumps are in contact with the first metal film, and the first resin film is heat-treated while the top of the first resin film is partially exposed to discharge the solvent or moisture from the exposed zone, and cure the first resin film. After curing, the bumps and the first metal film may be ultrasonically bonded to each other. A second resin film and a third metal film may be further layered to form a multilayer structure.

6 Claims, 7 Drawing Sheets

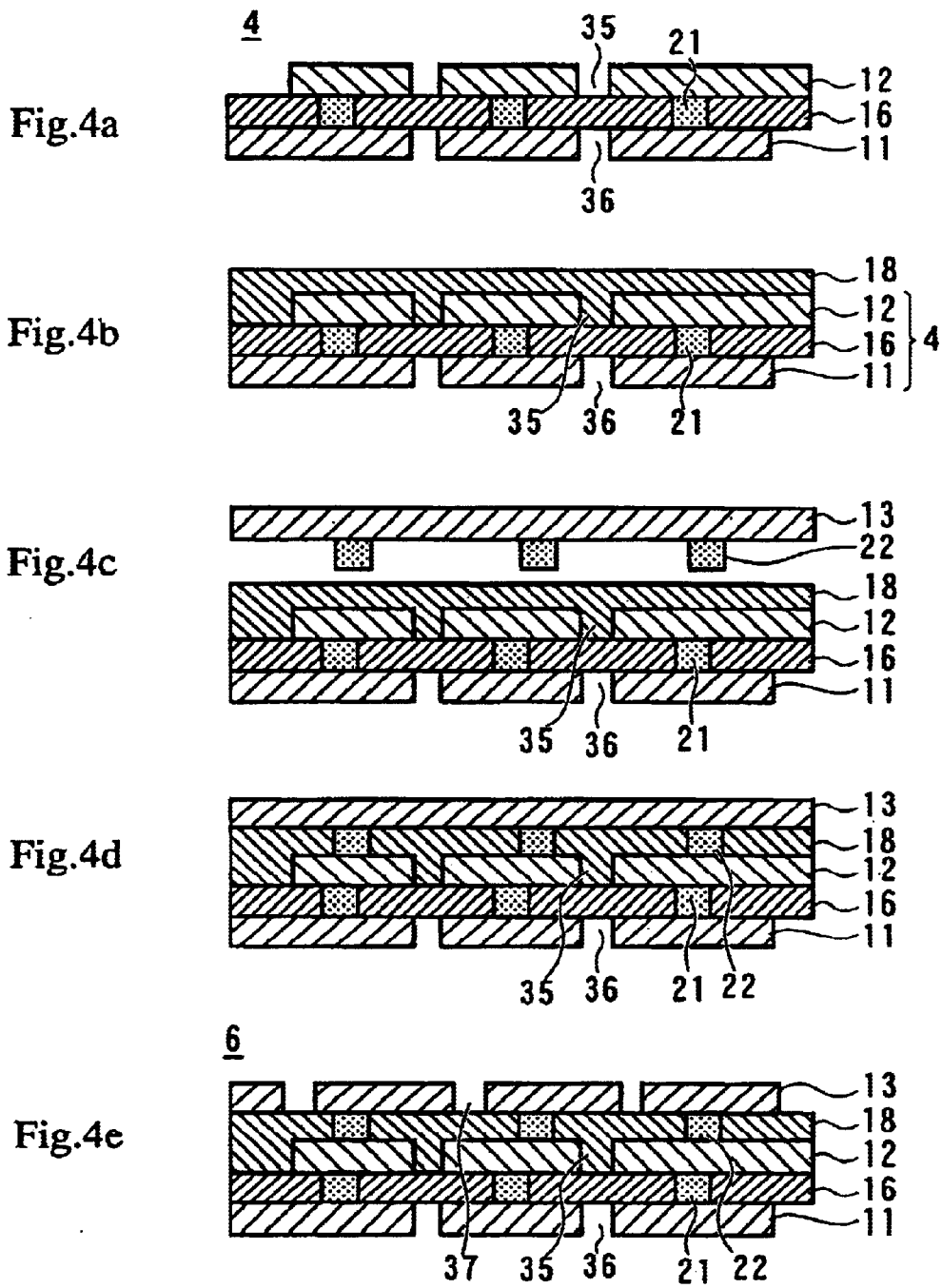

PROCESSES FOR MANUFACTURING FLEXIBLE WIRING BOARDS AND THE RESULTING FLEXIBLE WIRING BOARD

FIELD OF THE INVENTION

The present invention relates to the field of flexible wiring boards, particularly the field of multilayer flexible wiring boards.

PRIOR ART

Double-sided flexible wiring boards having patterned metal films on both sides of a resin film are widely used because of the high degree of freedom of interconnection.

The metal films on both sides of the resin film are electrically connected to each other. Conventional methods for connecting these metal films are explained below.

First, the through hole method is explained. Referring to FIG. 7(a), the reference number 110 represents a base material for flexible wiring boards having metal films 112, 113 consisting of a copper foil adhered to the top surface and the bottom surface of a polyimide film 111.

This base material 110 is punched with a drill or the like to form a through hole 118 as shown in FIG. 7(b). Then, the assembly is carbonized and then electroplated, so that a copper plating layer 115 grows within the through hole 118 and on the surfaces of the metal films 112, 113 to connect the two metal films 112, 113 via the copper plating layer 115 within the through hole 118, as shown in FIG. 7(c).

Secondly, the via hole method is explained. Referring to FIG. 8(a), a base material 120 having a polyimide film 121 adhered on a metal film 122 consisting of a copper foil is prepared and an opening 128 is formed in the polyimide film 121 by photolithography (FIG. 8(b)).

Thus, the metal film 122 is exposed at the bottom of the opening 128, and a copper thin film is formed by sputtering on the surface of the metal film 122 exposed at the bottom of the opening 128 and on the surface of the polyimide film 121 in this state followed by electroplating to form a copper plating layer 123 on the top surface of the polyimide film 121 and the inner face of the opening 128 and the top of the metal film 122 exposed at the bottom of the opening 128. This copper plating layer 123 is connected to the metal film 122 at the bottom of the opening 128.

However, the through hole connection method requires a long time to form many through holes 118 because through holes 118 are drilled one by one. Moreover, it cannot satisfy the demand for fine patterns because the size of through holes 118 is limited to about 0.2 mmφ.

The metal film 123 formed by the via hole method is easily separated because of the weak adhesive power between the copper plating layer 123 and the polyimide film 121. Furthermore, defects such as pinholes are more liable to occur in the copper plating layer 123 to make inferior the reliability.

An object of the present invention is to overcome the disadvantages of the prior art described above and to provide a technique that can connect metal films without forming any opening.

SUMMARY OF THE INVENTION

In order to attain the above object, the present invention provides a process for manufacturing a flexible wiring board, comprising the steps of forming an uncured first resin film including a solvent on a first metal film, pressing bumps on a second metal film against said first resin film to force said bumps into said first resin film until the tops of said bumps come into contact with said first metal film, then patterning at least one of said first or second metal films, and heat-treating said first resin film while the top surface of said first resin film is at least partially exposed to cure said first resin film.

In one embodiment of the process for manufacturing a flexible wiring board according to the present invention, said uncured first resin film is semicured by heating it before said bumps are pressed against said first resin film.

In another embodiment of the process for manufacturing a flexible wiring board according to the present invention, said semicuring step takes place at a temperature lower than the boiling point of said solvent included in said uncured first resin film.

In another embodiment of the process for manufacturing a flexible wiring board according to the present invention, said semicuring step takes place at a temperature ranged from 80° C. to 300° C.

In another embodiment of the process for manufacturing a flexible wiring board according to the present invention, said first resin film is softened by heating it when said bumps are forced into said first resin film.

In another embodiment of the process for manufacturing a flexible wiring board according to the present invention said curing step is followed by applying ultrasonic wave to either one or both of said bumps and said first metal film to connect said bumps to said first metal film.

In another embodiment of the process for manufacturing a flexible wiring board according to the present invention, said step of curing said first resin film is preceded by patterning either one of said first or second metal film and ultrasonic treating the unpatterned metal film and then patterning it.

Another embodiment of the process for manufacturing a flexible wiring board according to the present invention further comprises the steps of forming a second resin film on the top surface of said patterned first or second metal film, then pressing bumps on a third metal film against said second resin film to force said bumps into said second resin film until they come into contact with said first or second metal film, then patterning said third metal film and then curing said second resin film.

In this embodiment, said uncured first resin film may be semicured by heating it before said bumps are pressed against said first resin film.

Another embodiment of the process for manufacturing a flexible wiring board according to the present invention further comprises the steps of forming a second resin film on the top surface of said patterned first or second metal film, then pressing bumps on a third metal film against said second resin film to force said bumps into said second resin film until they come into contact with said first or second metal film, then patterning said third metal film, then curing said second resin film and then applying ultrasonic wave to said bumps on said third metal film to connect said bumps to said first or second metal film.

In this embodiment, said curing step may be followed by applying ultrasonic wave to said bumps on said third metal film to connect said bumps to said first or second metal film. It is possible to apply ultrasonic wave indirectly to said bumps by applying ultrasonic wave to said first or second metal film to connect said bumps to said first or second metal film. It is also possible to apply ultrasonic wave to both said bumps and said first or second metal film.

In this embodiment, said uncured first resin film may also be semicured by heating it before said bumps are pressed against said first resin film.

The present invention also provides a flexible wiring board comprising a plurality of patterned metal films with a resin film being interposed therebetween among which adjacent two metal films are electrically connected to each other via bumps, wherein said resin film is cured after said bumps are pressed against the top surface of said resin film and forced into said resin film to electrically connect said two metal films via said bumps.

In one embodiment of the flexible wiring board according to the present invention, said resin film is cured by heat-treating it while the surface of said resin film is at least partially exposed between said patterned metal films.

In another embodiment of the flexible wiring board according to the present invention, one of said two adjacent metal films connected via said bumps is ultrasonically bonded to said, bumps.

According to the present invention as defined above, bumps are pressed against a first resin film and forced into the first resin film. Thus, the bumps can be contacted with the metal film underlying the first resin film without forming any opening in the first resin film. The first resin film is preferably softened by heating it when the bumps are forced into the first resin film.

The bumps may be forced into the resin film by applying ultrasonic wave to the bumps digging or softening the semicured resin film in contact with the bumps.

When the bumps are embedded into the first resin heated, the first and second metal films are adhered to the first resin film. When at least one of the first and second metal films is patterned in this state to form an opening, the top of the first resin film is exposed at the bottom of the opening.

In this case, the top surface of the first resin film is partially covered with the first or second metal film and partially exposed. When the first resin film is heated in this state, the solvent and moisture included in the first resin film or the moisture generated during the progress of the chemical reaction caused by heating is discharged from the exposed first resin film so that the first resin film is cured. This curing step gives a double-sided flexible wiring board.

The curing step allows the first resin film to thermally shrink and the bumps to be strongly pressed against the first metal film, whereby the first and second metal films are electrically connected via the bumps.

In this case, ultrasonic wave may be applied to cause ultrasonic vibration interface between the bumps and the first metal film after the first resin film has been cured, so that the first metal film and the bumps are bonded by ultrasonic vibration energy. Ultrasonic wave may be applied on either side of the first metal film or the second metal film.

The height of the bumps used for connecting metal films is preferably greater than the thickness of the first resin film in which the bumps are to be embedded.

BRIEF DESCRIPTION OF THE DRAWINGS

FIGS. 4(a)–(e) is a flow sheet showing a process for manufacturing a flexible wiring board having a multilayer structure according to the present invention (the first half).

DETAILED DESCRIPTION OF THE INVENTION

An example of flexible wiring board of the present invention and a process for manufacturing it will now be described.

First metal film will be described after-mentioned description.

Figure 1A:
FIGS. 1(a)–(e) is a processing diagram showing a process for manufacturing a flexible wiring board according to the present invention (early steps).
Figure 1B:

Referring to FIG. 1(a), the reference number 11 represents a second metal film consisting of a rolled copper foil having a thickness of about 10 $\mu$m–20 $\mu$m. A carrier film 32 and a photosensitive film 33 are adhered to the top surface and the bottom surface of the second metal film 11, respectively (FIG. 1(b)).

Figure 1C:
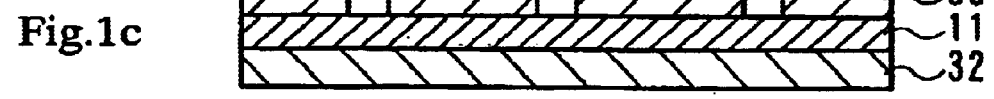

Then, the photosensitive film 33 is photographically patterned to form an opening 34 (FIG. 1(c)). The second metal film 11 is exposed at the bottom of this opening 34.

Figure 1D:
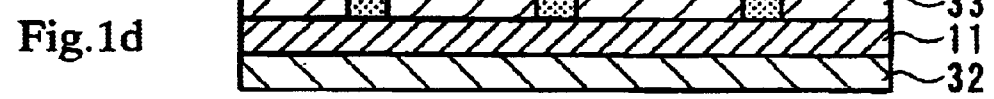

When the assembly is immersed into a plating solution for electroplating, copper is deposited on the second metal film 11 exposed at the bottom of the opening 34. Copper deposits fill the opening 34. The reference number 21 in FIG. 1(d) represents a bump formed from copper deposited in the opening 34.

Figure 1E:

Then, the carrier film 32 and the photosensitive film 33 are removed to expose the top surface and the bottom surface of the second metal film 11. Bumps 21 stand on the top surface of the second metal film 11 (FIG. 1(e)).

Figure 2A:
FIGS. 2(a)–(d) is a processing diagram showing a process for manufacturing a flexible wiring board according to the present invention (middle steps).
Figure 2B:

Separately from the second metal film 11, a first metal film 12 consisting of a rolled copper foil having a thickness of 9 $\mu$m–35 $\mu$m is prepared (FIG. 2(a)), and a polyimide precursor solution is applied on its surface and heat-treated to form a first resin film 16 consisting of a polyimide film (FIG. 2(b)).

The heat treatment temperature is lower than the boiling point of the solvent for the polyimide precursor solution. The heat treatment was carried out at a temperature (150° C.–200° C.) lower than the boiling point 202° C. of the solvent N-methyl pyrrolidone for the polyimide precursor solution used here. The first resin film 16 in this state has been only slightly imitated and semicured.

Although the first resin film 16 here was formed by applying a polyimide precursor solution and heat-treating it, a preliminarily semicured resin film such as polyimide may be adhered onto the first metal film 12 to form the first resin film 16.

Figure 2C:
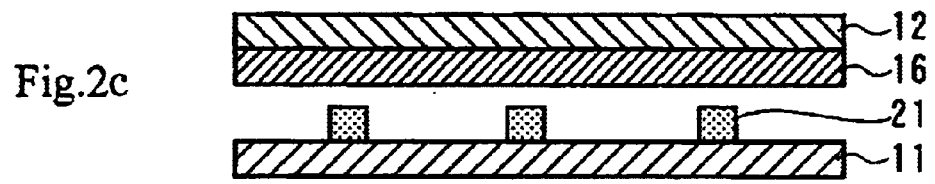

Then, the bumps 21 on the second metal film 11 treated as above are faced to the first resin film 16 on the first metal film 12 as shown in FIG. 2(c) and hot-pressed to force the bumps 21 into the first resin film 16.

Figure 2D:
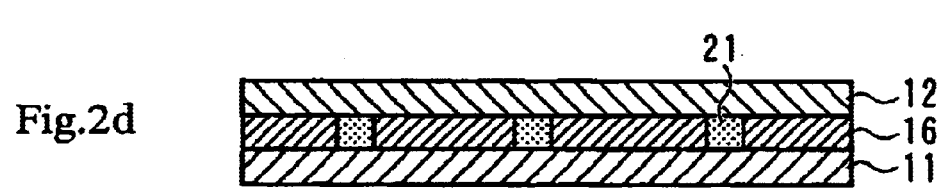

FIG. 2(d) shows that the bumps 21 have been forced into the resin film 16 so that they are in contact with the first metal film 12 underlying the first resin film 16.

Hot-pressing softens the first resin film 16 to help the bumps 21 to be forced into it and induces adhesion on the surface of the first resin film 16 to adhere the second metal film 11 to the first resin film 16.

The hot-pressing conditions here are 50 kg/cm$^2$ at 150°0 C. and the hot-pressing period is about 10 minutes.

Figure 3A:
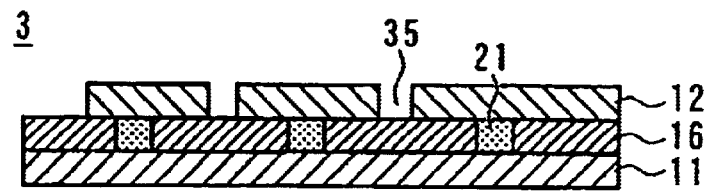
FIGS. 3(a)–(d) is a flow sheet showing a process for manufacturing a flexible wiring board according to the present invention (late steps).

Then, a patterned resist layer is formed on the top surface of the first metal film 12 and etched to pattern the first metal film 12. After etching, the resist layer is removed to give a flexible wiring board 3 having the patterned first metal film 12 (FIG. 3(a)). The reference number 35 in FIG. 3(a) represents an opening formed removal zone of the patterned first metal film 12. The opening 35 is a zone dividing wiring from each other. The first resin film 16 is exposed at the bottom of the opening 35. However, the first resin film 16 is not exposed at the bottom surface of the first resin film 16 on the side of the second metal film 11.

When this flexible wiring board 3 is heat-treated at a temperature of 160° C.–350° C. in a baking apparatus for several hours, the residual solvent included in the first resin film 16 is discharged into the atmosphere from the exposed first resin film 16 at the bottom of the opening 35 in the patterned first metal film 12. This heat treatment degases the first resin film 16 and promotes imidation reaction within the first resin film 16 to cure the first resin film 16. The moisture generated during imidation reaction is discharged from the exposed first resin film 16 by heat treatment.

Once the first resin film 16 is cured by this imidation reaction, the first and second metal films 12, 11 are fixed to the first resin film 16. During then, the first resin film 16 thermally shrinks and the bumps 21 are pressed against the first metal film 12, whereby the first and second metal films 12, 11 are electrically connected via the bumps 21.

Then, the bumps 21 and the first metal film 12 are ultrasonically bonded to enhance the reliability of their electric connection.

Figure 6:
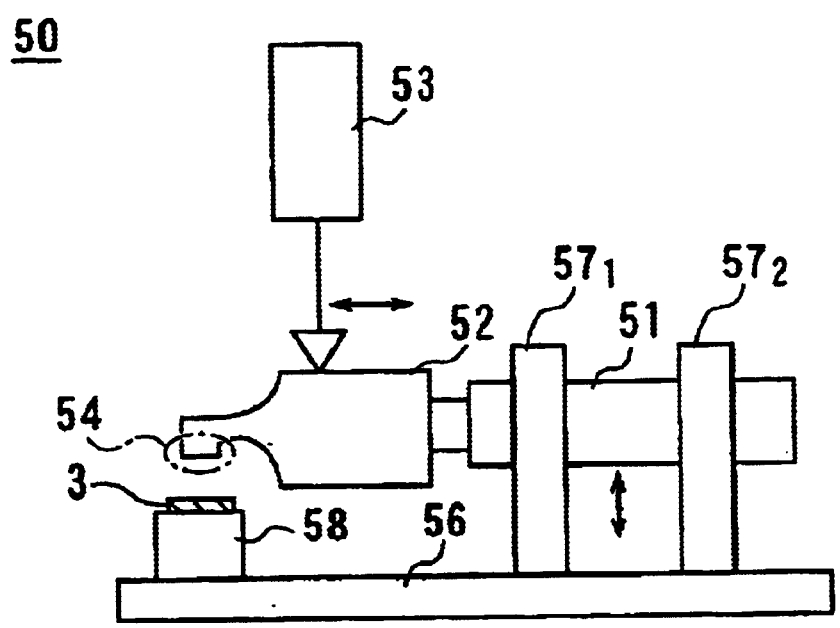
FIG. 6 shows an example of ultrasonic welding apparatus used in the process according to the present invention.
Figure 7A:
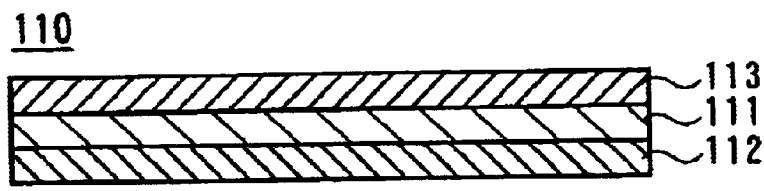
FIGS. 7(a)–(c) is a flow sheet showing the conventional through hole method.
Figure 7B:
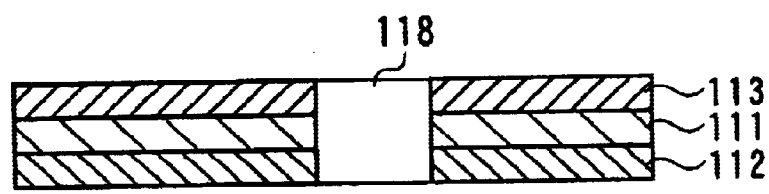
Figure 7C:
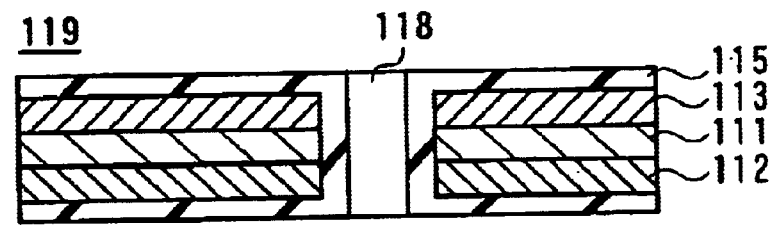
Figure 8A:
FIGS. 8(a)–(c) is a flow sheet showing the conventional via hole method.
Figure 8B:
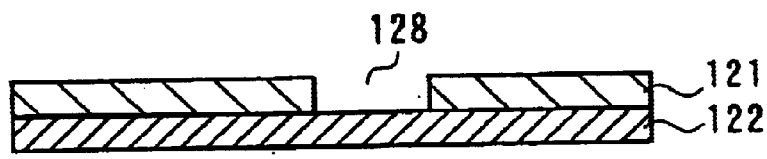
Figure 8C:
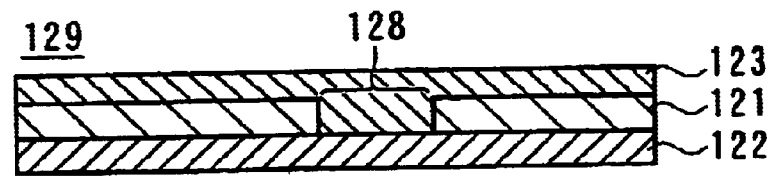

The reference number 50 in FIG. 6 represents an ultrasonic bonding apparatus used for this ultrasonic bonding.

This ultrasonic bonding apparatus 50 comprises a platform 56, two guide posts $57_1$, $57_2$ upright on the platform 56, an ultrasonic wave generator 51 supported to be vertically movable by the guide posts $57_1$, $57_2$, and a resonator 52 attached to an end of the ultrasonic wave generator 51.

A working table 58 is placed on the platform 56 and a flexible wiring board 3 imitated as described above is mounted on the top of the working table 58.

When a planer tip 54 of the resonator 52 is positioned in parallel to the surface of the working table 58 and an air cylinder 53 of the ultrasonic bonding apparatus 50 is activated so that the ultrasonic wave generator 51 and the resonator 52 vertically descend along the guide posts $57_1$, $57_2$. The tip 54 of the resonator 52 comes into close contact with the flexible wiring board 3.

Figure 3B:
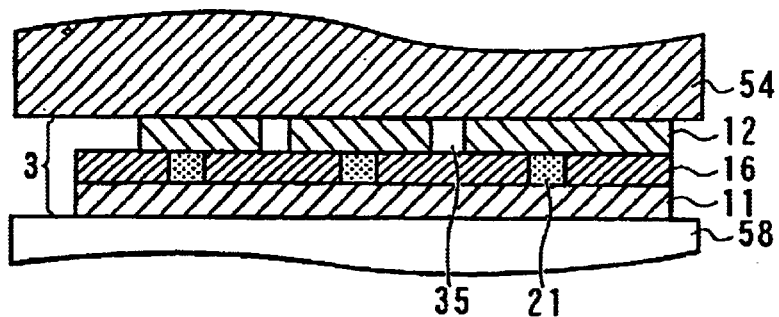

This state is shown in FIG. 3(b), in which the tip 54 of the resonator 52 is pressed against the flexible wiring board 3 by the air cylinder 53 so that the tops of the bumps 21 are strongly pressed against the first metal film 12 because the first resin film 16 is softer than the first and second metal films 12, 11 and the bumps 21.

When the ultrasonic wave generator 51 is activated in this state to apply ultrasonic wave to the resonator 52, the ultrasonic wave resonates within the resonator 52 so that the tip 54 of the resonator 52 ultrasonically vibrates. This ultrasonic vibration causes rubbing interface between the first metal film 12 and the bumps 21, whereby the tops of the bumps 21 are metallically bonded to the first metal film 12. In this case, preliminary solder plating on the bumps 21 further facilitates bonding.

Figure 3C:
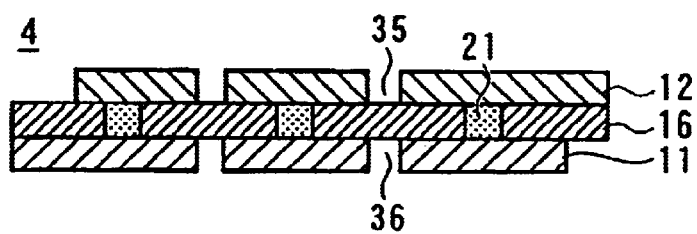
Figure 3D:
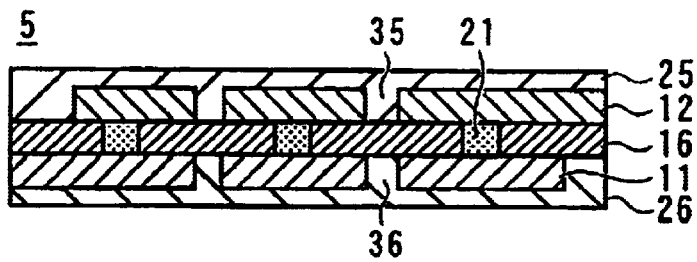

The flexible wiring board 3 is removed from the ultrasonic bonding apparatus 50 and a patterned resist layer is formed on the top surface of the second metal film 11, which is then etched. After etching, the resist layer is removed. The reference number 36 in FIG. 3(c) represents an opening formed in the patterned second metal film 11.

An overcoat solution is applied on the surfaces of the first and second metal films 12, 11 of this flexible wiring board 4 and polymerized into film to form overcoat layers 25, 26, whereby a double-sided flexible wiring board 5 is obtained. Other electronic components can be connected to the first and second metal films 12, 11 exposed from openings not shown formed in predetermined zones of the overcoat layers 25, 26.

Although overcoat layers 25, 26 may be formed to prepare a double-sided flexible wiring board 5, the flexible wiring board 4 having the first and second metal films 12, 11 exposed can also be used to prepare a flexible wiring board having a multilayer structure.

FIG. 4(a) shows a flexible wiring board 4 having the first and second metal films 12, 11 exposed on the top surface and the bottom surface of the first resin film 16. (This flexible wiring board 4 is the flexible wiring board 4 shown in FIG. 3(c).) A polyimide precursor solution is applied on the top surface of the flexible wiring board 4 and heat-treated to form a second resin film 18 consisting of a polyimide film shown by the reference number 18 in FIG. 4(b). This second resin film 18 has not been imitated.

A third metal film 13 having bumps 22 is prepared, and the bumps 22 are faced to the second resin film 18 (FIG. 4(c)) and brought into contact with the second resin film 18 and hot-pressed, whereby the bumps 22 are forced into the second resin film 18 until the tops of the bumps 22 come into contact with the patterned first metal film 12. During then, the third metal film 13 is bonded to the second resin film 18.

Then, a patterned resist layer is formed on the top surface of the third metal film 13, which is then patterned by etching.

The reference number 37 in FIG. 4(e) represents an opening in the patterned third metal film 13. The assembly is heat-treated while the top surface of the second resin film 18 is exposed at the bottom of this opening 37 under the same conditions as above to discharge the solvent and moisture from the opening 37 and thus imidate the second resin film 18.

This imidation allows the third metal film 13 to be fixed to the second resin film 18, which thermally shrink to press the bumps 22 against the first metal film 12, whereby the first and third metal films 12, 13 are electrically connected via the bumps 22. Thus, the first to third metal films 12, 11, 13 are electrically connected via the bumps 21, 22.

Figure 5A:
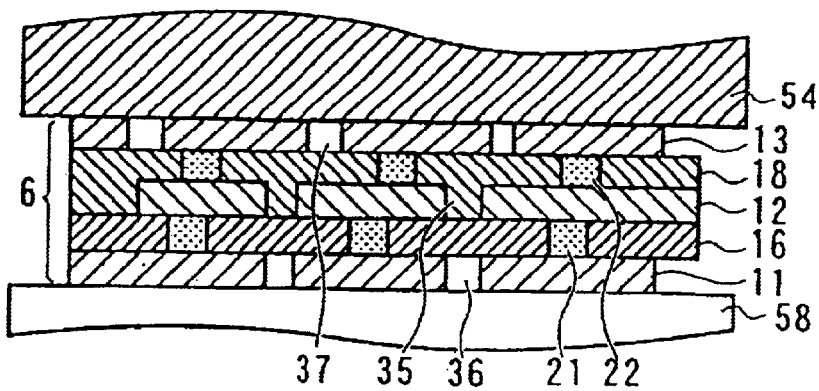
FIGS. 5(a)–(c) is a flow sheet showing a process for manufacturing a flexible wiring board having a multilayer structure according to the present invention (the second half).
Figure 5B:
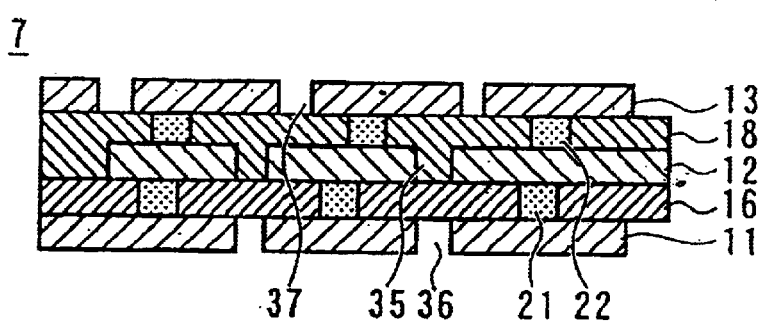
Figure 5C:
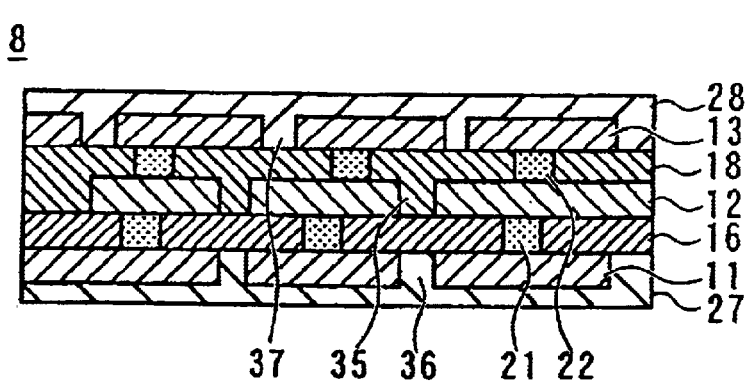

Then, the flexible wiring board 6 in this state is mounted on the working table 58 in the ultrasonic bonding apparatus 50 shown in FIG. 6 and brought into contact with the tip 54 of the resonator 52. When the ultrasonic wave is applied, the bumps 22 ultrasonically vibrate and are ultrasonically bonded to the first metal film 12 in contact with them. After ultrasonic bonding, the flexible wiring board removed from the ultrasonic bonding apparatus 50 has a multilayer structure shown by the reference number 7 in FIG. 5(b).

A polyimide precursor may be applied on this flexible wiring board 7 to form a resin film, which may be further layered on a metal film having bumps and imitated. In this case, the steps shown in FIGS. 4(b)–(e) and FIG. 5(a) are repeated.

An overcoat solution may be applied on the top and the bottom of this flexible wiring board 7 and cured to form overcoat layers 27, 28 on the second and third metal films 11, 13.

As has been described above, the present invention can simplify the process because patterned metal wiring films can be connected via bumps without preliminarily providing openings in the polyimide film.

The present invention also improves reliability because bumps and patterned metal wiring films are steadily electrically connected using an ultrasonic bonding apparatus.

Although the multilayer flexible wiring board 8 was formed by two steps of ultrasonic bonding according to the foregoing embodiments, the first to third metal films 11, 12, 13 may also be connected via bumps 21, 22 by a single application of ultrasonic wave.

Solder coat or gold coat may be formed on the bump tops to facilitate ultrasonic bonding.

Although the polyimide precursor solution used for forming the first or second resin film 16, 18 included N-methyl pyrrolidone as a solvent in the foregoing embodiments, polyimide precursor solutions including other solvents such as formalin or N-methylamide may also be used.

Instead of polyimide precursor solutions, liquid raw materials of other resins may also be used, such as liquid raw materials of modified epoxy resins, liquid raw materials of polyester resins or liquid raw materials of polyethylene resins.

When polyester liquid raw materials or the like include an organic solvent, a semicuring step can take place by heating to a temperature at or below the boiling point of the organic solvent.

Alternatively, a semicured resin film such as a modified epoxy resin, polyester resin or polyethylene resin may be used.

Even if a non-polyimide resin liquid raw material is used to form first and second resin films 16, 18 or a semicured resin film is adhered to form first and second resin films 16, 18, it is also preferable to discharge either one of the organic solvent or moisture or both from the partially exposed resin film surfaces when the resin films are cured by heating after the bumps are forced into the semicured resin films.

In brief, the present invention widely includes processes for manufacturing a flexible wiring board, comprising the steps of pressing bumps into a uncured or semicured resin prior to a curing step to connect metal films on the top surface and the bottom surface of the uncured or semicured resin film via the bumps, and heat-treating the partially exposed resin film to cure it.

Although the metal films described above consisted of copper, other metals may also be used. Gold or other plating coats may be formed on metal films.

Although the resin film 16 was cured before the second metal film 11 was patterned in the foregoing embodiments, the first resin film 16 may also be cured after the first and second metal films 12, 11 have been patterned.

On the contrary, the first metal film 12 may be patterned and then the bumps 21 on the second metal film 11 may be pressed into the first resin film 16 on the top of the first metal film 12 to cure the first resin film 16 in this state. In brief, metal films in contact with bumps may be in the form of a metal foil or a patterned wiring film.

The process can be simplified by contacting bumps with a metal film underlying a resin film without forming any opening.

Moreover, electric reliability can be improved by applying ultrasonic wave to bumps and metal films in contact with the bumps to connect them by ultrasonic vibration energy.

What is claimed is:

1. A flexible wiring board comprising a plurality of patterned metal films with a resin film being interposed therebetween, among which at least adjacent two patterned metal films are electrically connected to each other via bumps, one of said patterned metal film having at least one opening, wherein said resin film includes a solvent and the resin film is thermally shrinkable to press said bumps against said at least adjacent two patterned metal films by discharging the solvent through at least one opening of said patterned metal film when heat is applied to the flexible wiring board.

2. The flexible wiring board according to claim 1 wherein said resin film is cured by heat-treating it while the top surface of said resin film is at least partially exposed between said patterned metal films.

3. The flexible wiring board according to claim 1 wherein one of said two adjacent metal films connected via said bumps is ultrasonically bonded to said bumps.

4. The flexible wiring board according to claim 2 wherein one of said two adjacent metal films connected via said bumps is ultrasonically bonded to said bumps.

5. The flexible wiring board according to claim 1 wherein said thermally shrinkable resin film shrinks to press said bumps between said two patterned metal films to electrically connect said two patterned metal films via said bumps.

6. A flexible wiring board comprising
   a first metal film,
   a second metal film,
   at least one bump between the first and second metal films to electrically connect the first and second metal films, and
   means for pressing the at least one bump against at least one of the first and second metal films by shrinking when heat is applied to the flexible wiring board.

* * * * *